(12) United States Patent
Happ et al.

(10) Patent No.: US 9,111,609 B2
(45) Date of Patent: Aug. 18, 2015

(54) CONCENTRIC PHASE CHANGE MEMORY ELEMENT

(75) Inventors: Thomas D. Happ, Dresdan (DE); Alejandro G. Schrott, New York, NY (US)

(73) Assignees: International Business Machines Corporation, Armonk, NY (US); Qimonda AG, Munich (DE)

( * ) Notice: Subject to any disclaimer, the term of this patent is extended or adjusted under 35 U.S.C. 154(b) by 743 days.

(21) Appl. No.: 13/364,727

(22) Filed: Feb. 2, 2012

(65) Prior Publication Data

US 2012/0134204 A1　May 31, 2012

Related U.S. Application Data

(62) Division of application No. 12/198,383, filed on Aug. 26, 2008, now Pat. No. 8,124,950.

(51) Int. Cl.
| | |
|---|---|
| H01L 21/00 | (2006.01) |
| G11C 13/00 | (2006.01) |
| H01L 45/00 | (2006.01) |
| G11C 11/56 | (2006.01) |

(52) U.S. Cl.
CPC ........ *G11C 13/0004* (2013.01); *G11C 11/5678* (2013.01); *H01L 45/06* (2013.01); *H01L 45/1233* (2013.01); *H01L 45/144* (2013.01); *H01L 45/148* (2013.01); *H01L 45/165* (2013.01); *H01L 45/1616* (2013.01); *H01L 45/1675* (2013.01); *H01L 45/1683* (2013.01)

(58) Field of Classification Search
None
See application file for complete search history.

(56) References Cited

U.S. PATENT DOCUMENTS

| | | | |
|---|---|---|---|
| 7,679,163 B2 * | 3/2010 | Chen et al. | 257/537 |
| 7,859,893 B2 | 12/2010 | Liu et al. | |
| 7,960,203 B2 * | 6/2011 | Schrott et al. | 438/84 |
| 2005/0112896 A1 | 5/2005 | Hamann et al. | |
| 2006/0091374 A1 | 5/2006 | Yoon et al. | |
| 2006/0118774 A1 | 6/2006 | Ovshinsky | |
| 2007/0059882 A1 | 3/2007 | Daley et al. | |
| 2007/0097739 A1 | 5/2007 | Happ et al. | |
| 2007/0246782 A1 * | 10/2007 | Philipp et al. | 257/379 |

* cited by examiner

*Primary Examiner* — Jack Chen
(74) *Attorney, Agent, or Firm* — Scully, Scott, Murphy & Presser, P.C.; Vazken Alexanian

(57) ABSTRACT

The present invention in one embodiment provides a memory device including a first electrode; a second electrode; and a memory cell positioned between the first electrode and the second electrode, the memory cell including a core of a first phase change material and a cladding of a second phase change material, wherein the first phase change material has a lower crystallization temperature than the second phase change material. The present invention also provides methods of forming the above described memory device.

9 Claims, 7 Drawing Sheets

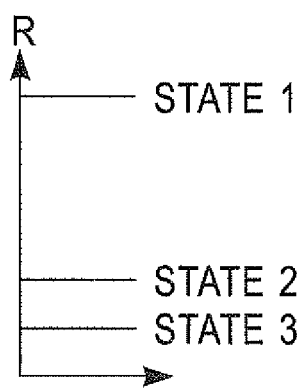 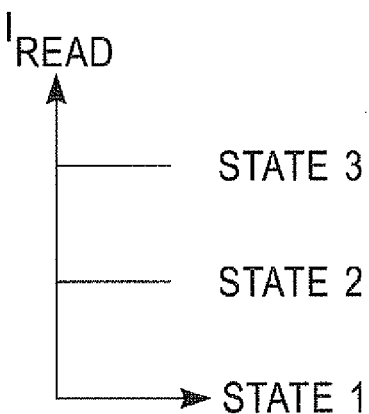
FIG. 12A  FIG. 12B
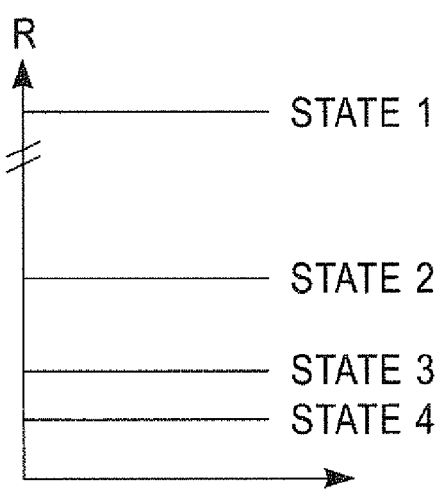 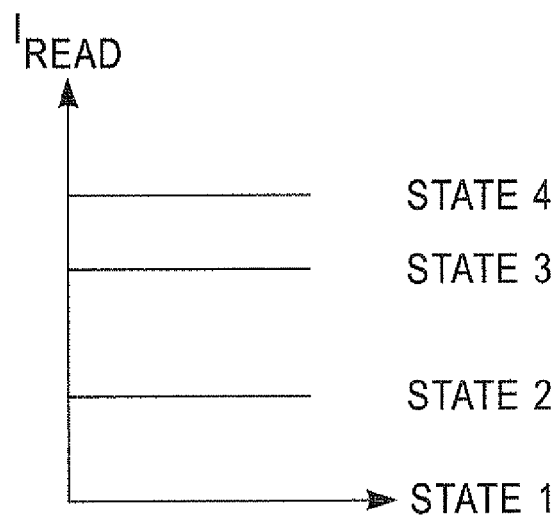
FIG. 13A  FIG. 13B

CONCENTRIC PHASE CHANGE MEMORY ELEMENT

CROSS REFERENCE TO RELATED APPLICATIONS

This application is a divisional application of U.S. Ser. No. 12/198,383, filed on Aug. 26, 2008. The entire contents of each of the aforementioned U.S. Application are incorporated herein by reference

FIELD OF THE INVENTION

In one embodiment, the present invention relates to memory devices including phase change materials.

BACKGROUND OF THE INVENTION

Phase change memory (PCM) devices store data using a phase change material, such as, for example, a chalcogenide alloy, that transforms into a crystalline state or an amorphous state. An electrode may provide a current through the PCM device to produce heat that effectuates phase changes in the PCM between the crystalline and the amorphous phases. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1".

SUMMARY OF THE INVENTION

The present invention, in one embodiment, provides a memory device including at least two phase change materials in the memory cell of the device. In one embodiment, the memory device includes a first electrode; a second electrode; and a memory cell positioned between the first electrode and the second electrode, the memory cell including a core of a first phase change material and a cladding of a second phase change material, wherein the first phase change material has a lower crystallization temperature than the second phase change material.

In another aspect, a method of manufacturing a memory device is provided that includes forming a pillar of a first phase change material atop a substrate, the substrate including a first electrically conductive material, the first phase change material is in electrical communication with the first electrically conductive material; and forming a layer of a second phase change material overlying the pillar of the first phase change material.

In another aspect, a method of operating a memory device is provided that includes providing a memory cell positioned between a first electrode and a second electrode, the memory cell including a core of a first phase change material and a cladding of a second phase change material, wherein the first phase change material is different from the second phase change material; producing a first memory state having a first read current, the first memory state being provided by the core of the first phase change material being in an amorphous state and the cladding of the second phase change material being in an amorphous state; providing a second memory state having a second read current being greater than the first read current, the second memory state being provided by the core of the first phase change material being in a crystalline state and the cladding of the second phase change material being in an amorphous state; and providing a third memory state having a third read current being greater than the second read current, the third memory state being provided by the core of the first phase change material being in a crystalline state and the cladding of the second phase change material being in a crystalline state.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIGS. 12(a) and 12(b) depict plots of the resistivity states (FIG. 12(a)) and the read current (FIG. 12(b)) of one embodiment of a three state phase change memory device, in accordance with the present invention.

FIGS. 13(a) and 13(b) depict plots of the resistivity states (FIG. 13(a)) and the read current (FIG. 13(b)) of one embodiment of a four state phase change memory device, in accordance with the present invention.

DETAILED DESCRIPTION OF THE INVENTION

Figure 1:
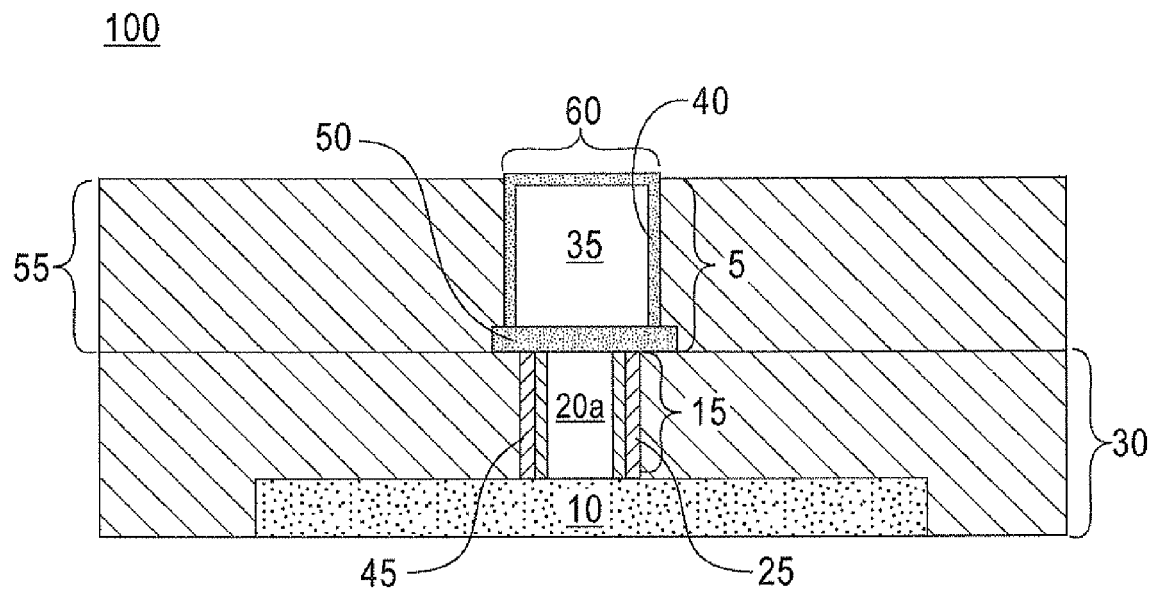
FIG. 1 is a side cross-sectional view of one embodiment of a memory device including a memory cell composed of two phase change materials, as used in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods for forming memory devices including a memory cell composed of at least two phase change materials. When describing the methods, the following terms have the following meanings, unless otherwise indicated.

As used herein, the term "memory device" means a structure in which the electrical state thereof can be altered and then retained in the altered state, in this way at least one bit of information can be stored.

"Volatile memory" means memory in which stored information is lost when power to the memory cell is turned off.

"Non-volatile memory" means memory in which information stored is maintained after the power supply is turned off.

As used herein, an "anisotropic etch process" denotes a material removal process in which the etch rate in the direction normal to the surface to be etched is greater than in the direction parallel to the surface to be etched.

As used herein, "insulating" denotes a material having a room temperature conductivity of less than about $10^{-10}$ $(\Omega\text{-m})^{-1}$.

"Electrically conductive" and/or "electrically communicating" as used through the present disclosure means a material typically having a room temperature conductivity of greater than $10^{-8}$ $(\Omega\text{-m})^{-1}$.

The term "electrical contact" denotes direct physical contact between two materials, wherein the interface between the two materials is electrically conductive.

The terms "direct physical contact" or "on" mean that the two structures are in contact without any intermediary conducting, insulating or semiconducting structures.

The terms "overlying", "underlying", "atop", and "abutting" define a structural relationship in which two structures are in contact where an intermediary structure of a conducting, insulating, or semiconducting material may or may not be present at the interface of the two structures.

As used herein, a "phase change material" denotes a material that converts from an amorphous phase to a crystalline phase or vice versa upon the application of energy.

The "crystallization temperature" is the temperature at which a phase change material experiences a phase change from an amorphous phase to a crystalline phase and vice versa.

As used herein, a "dielectric" is a non-metallic solid displaying insulating properties.

The term "core" denotes that the first phase change material is present occupying the centermost volume of the memory cell.

The term "cladding" denotes that the second phase change material is present on the exterior sidewall surface of the core.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

Figure 2:
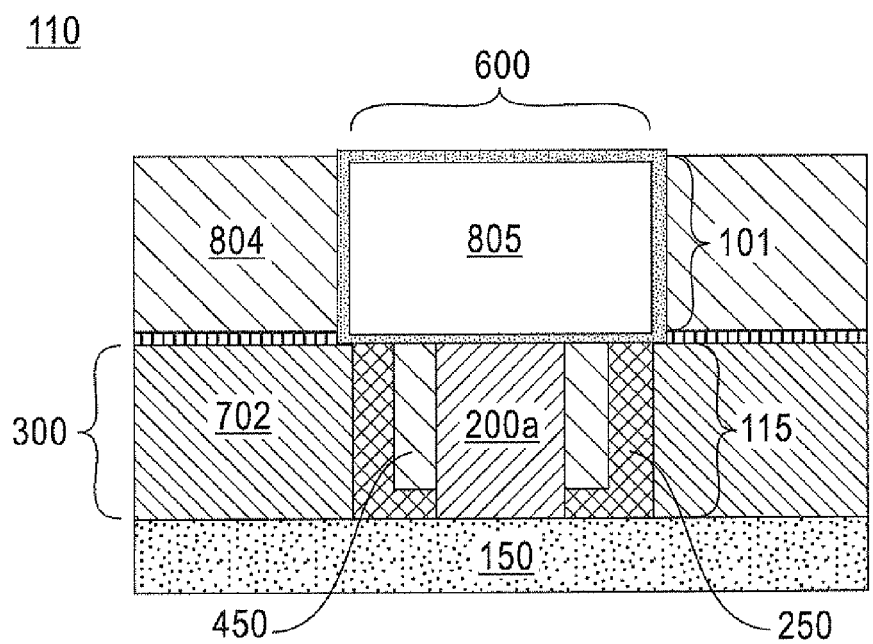
FIG. 2 is a side cross-sectional view of another embodiment of a memory device including a memory cell composed of two phase change materials, as used in accordance with the present invention.

FIGS. 1 and 2 depict embodiments of memory device including a memory cell composed of two phase change materials.

Referring to FIG. 1, the memory device 100 may include a first electrode 5, a second electrode 10, and a memory cell 15 positioned between the first electrode 5 and the second electrode 10. The memory cell 15 includes a core of a first phase change material 20a and a cladding of a second phase change material 25. In one embodiment, the first phase change material 20a has a lower crystallization temperature than the second phase change material 25.

In one embodiment, the cross section of the memory cell 15 when viewed from a top down view illustrates the concentric geometry of the core of the first phase change material 20a and the cladding of the second phase change material 25. Concentric means that the geometry defined by the perimeter of the structure when viewed from a top planar view is substantially circular. A dielectric spacer 45 may be present between the core of the first phase change material 20a and the cladding of the second phase change material 25. The dielectric spacer 45 may be omitted in some instances as well.

The first phase change material 20a may be composed of GeSbTe (GST), GeSb, SbTe, GeTe, GeGaSb, SiSbTe, AgInSbTe, AlInAg (aluminum/indium/silver), InAgSbAl, (indium/silver/antimony/aluminum) or a combination thereof. The second phase change material 25 may be composed of GeSbTe (GST), GeSb, SbTe, GeTe, GeGaSb, SiSbTe, AgInSbTe, AlInAg (aluminum/indium/silver), InAgSbAl (indium/silver/antimony/aluminum) or a combination thereof. In one embodiment, the first phase change material 20a is "undoped", and the second phase change material 25 is doped, wherein the dopant increases the crystallization temperature of the phase change material. The term undoped means that the phase change material is substantially free of dopants and impurities. The term "substantially free of dopants and impurities" means that dopants are present in less than 1.0 wt %. In one example, the second phase change material 25 is doped, wherein the dopant concentration ranges from greater than 1.0 wt % and less than 10.0 wt %. In one embodiment, the crystallization temperature of the first phase change material 20a may range from 150° C. to 220° C. In another embodiment, the crystallization temperature of the second phase change material 25 ranges from 230° C. to 350° C.

The memory cell 15 may be present in an interlevel dielectric layer 30 between the first electrode 5 and a second electrode 10. The first electrode 5 may further include a metal stud 35 and a metal nitride liner 40. In one embodiment, the first electrode 5 further includes an electrically conductive landing pad 50. Embodiments of the present invention have been contemplated, in which the electrically conductive landing pad 50 is omitted. Although not depicted in the drawings, the second electrode 10 may be present in a substrate, such as an insulating or semiconducting substrate.

FIG. 2 depicts another embodiment of the inventive memory device 110, which includes a first electrode 101, a second electrode 105, and a memory cell 115 positioned between the first electrode 101 and the second electrode 105. As illustrated, the memory cell 115 includes a core of a first phase change material 200a and a cladding of a second phase change material 250.

The various components of the structure shown in FIGS. 1 and 2, as well as embodiments of the process that can be used in forming the devices depicted in FIGS. 1 and 2, or similar to the devices depicted in FIGS. 1 and 2, will now be described in greater detail referring to FIGS. 3-11.

Figure 3:
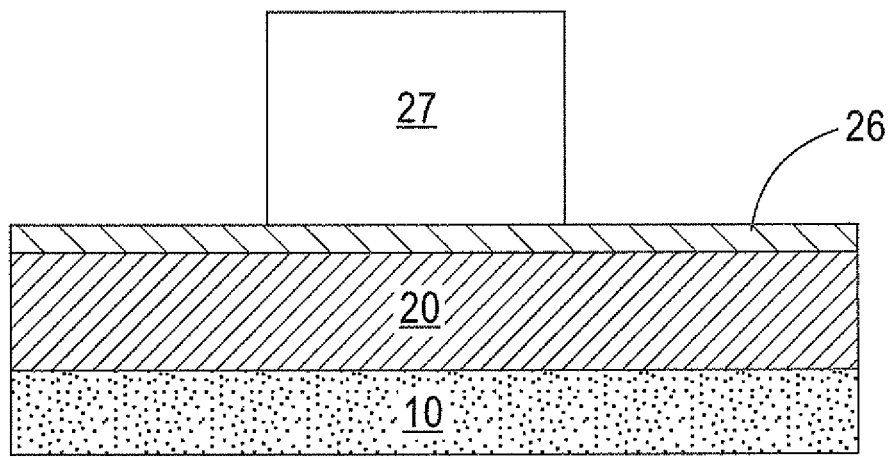
FIG. 3 is a side cross-sectional view depicting one embodiment of an initial structure that includes a photoresist present atop a layer of a first dielectric material that is present atop a layer of a first phase change material that is present on a substrate including a first electrically conductive material, as used in accordance with the present invention.

FIGS. 3-8 depict one embodiment of a method for forming the semiconducting device depicted in FIG. 1. FIG. 3 depicts forming a photoresist mask 27 atop a layer of a first dielectric material 26 that is present atop a layer of a first phase change material 20 that is present on a substrate including a first electrically conductive material 10, hereafter referred to as second electrode 10. In different embodiments, first mask material 27 may be a conducting material such as a metal or semiconducting. It is noted that the reference to a second electrode denotes that the electrode is underlying the memory cell 15 that is depicted in the supplied figures. It is further noted that the description of the structures including the first electrode 5, i.e., the electrode overlying the memory cell, and the second electrode 10, i.e., the electrode underlying the memory cell, are provided for illustrative purposes only and are not intended to limit the invention, as the positioning of the first electrode 5 and second electrode 10 may be inversed.

The present method may begin following the formation of semiconductor devices, such as diodes or transistors (FETs), on a semiconductor wafer. The second electrode 10 may be composed of a metal, such as Cu or W. In another embodiment, the second electrode 10 may include a metal stud that provides electrical conductivity to an interlevel terminal (source/drain) of a select/access transistor (not shown) that is formed within or upon the underlying substrate (not shown). The second electrode 10 may be present in an interlevel dielectric material that may also include at least one metal bar (not shown), wherein the metal bar is a conducting line that may be used to provide electrical conductivity to the second terminal (source/drain) of a select/access transistor positioned in the underlying substrate. The layer of the interlevel dielectric material may further include a lower conductive line (not shown). The lower conductive line may be a word line, which may bias the gate of the select/access transistor that links the second electrode 10 with the metal bar. It is noted that in the drawings, the second electrode 10 is present as a singular layer at the base of the structure, but this depiction is not intended to limit the invention, as any electrode configuration is suitable for use with the present invention. As described above, the second electrode 10 may be positioned atop a substrate, i.e., insulating or semiconducting substrate, and in another example, the second electrode 10 may be positioned within a via in the substrate.

Following the formation of the second electrode 10, a layer of the first phase change material 20 is formed in electrical communication with the second electrode 10. In one embodiment, the layer of first phase change material 20 is formed in direct physical contact with the second electrode 10. In another embodiment, the layer of the first phase change material 20 may be formed overlying the second electrode 20, wherein an interface layer, such as a diffusion barrier may be positioned between the layer of the first phase change material 20 and the second electrode 10.

The thickness of the layer of the first phase change material 20 may range from about 5 nm to about 400 nm. The deposition of the layer of the first phase change material 20 may include blanket deposition followed by planarization.

In one embodiment, the layer of the first phase change material 20 may be switched from an amorphous phase to a crystalline phase. When in an amorphous state, the layer of the first phase change material 20 exhibits a high resistivity. In one embodiment, the amorphous resistivity may range from $10^2$ ohm-m to $10^4$ ohm-m. When in a crystalline state, the layer of the first phase change material 20 is more conductive, typically exhibiting a lower resistivity by a factor of 10-10000. The layer of the first phase change material 20 may include chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material has a composition of $Ge_2Sb_2Te_5$ (GST). Although chalcogenides are a group of materials commonly utilized as phase change material, some phase change materials, such as GeSb, do not utilize, chalcogenides. In one embodiment, the layer of the first phase change material is composed of GeSbTe (GST), GeSb, SbTe, GeTe, GeGaSb, SiSbTe, AgInSbTe or a combination thereof. In one embodiment, the first phase change material 20 is undoped. The term undoped means that the phase change material is substantially free of dopants and impurities. The term substantially free of dopants and impurities means that dopants are present in less than 1.0 wt %.

In the embodiment depicted in FIGS. 3-8, the layer of the first phase change material 20 is subsequently processed to provide a pillar of the first phase change material 20a, wherein layer of a second phase change material 25 is deposited overlying the pillar of the first phase change material 20a to provide a memory cell 15 composed of two phase change materials. In one embodiment, the layer of the first phase change material 20 has a lower crystallization temperature than the layer of the second phase change material 25. In one embodiment, the crystallization temperature of the layer of the first phase change material 20 ranges from 130° C. to 220° C. In another embodiment, the crystallization temperature of the layer of the first phase change material 20 ranges from 140° C. to 170° C. In an even further embodiment, the crystallization temperature of the layer of the first phase change material 20 ranges from 140° C. to 150° C. In one example, the first phase change material 20 has a crystallization temperature ranging from 120° C. to 200° C. and a crystallization time ranging from 1 nanosecond to 100 nanosecond.

When the layer of the first phase change material 20 is composed of $Ge_2Sb_2Te_5$ and at a temperature of about 20° C., the first phase change material 20 may be in an amorphous phase. As the temperature of the $Ge_2Sb_2Te_5$ phase change material is increased to about 140° C. to about 170° C., i.e., raised to the crystallization temperature, the resistivity of the phase change material decreases representing the transition temperature for a phase change from an amorphous phase to a Face Centered Cubic (FCC) phase. Further increases in the temperature of the Ge2Sb2Te5 phase change material to greater than about 350° C. result in further decreases in resistivity, which result from a phase change from the Face Centered Cubic (FCC) phase to a Hexagonal (Hex) phase of the GST. When the temperature of the $Ge_2Sb_2Te_5$ phase change material is increased above the melting temperature (approximately 620° C.), the GST phase change material melts and upon quench returns to the amorphous solid phase. Quench denotes solidification in a time period ranging from 0.5 nanoseconds to 50 nanoseconds.

Referring to FIG. 3, in a following process step, a first dielectric layer 26 is deposited atop the first phase change material 20. The first dielectric layer 26 may be formed atop the layer of the first phase change material 20 by a deposition process including, for example, chemical vapor deposition (CVD), plasma-assisted CVD, evaporation, spin-on coating, or chemical solution deposition. "Chemical Vapor Deposition" is a deposition process in which a deposited species is formed as a result of a chemical reaction between gaseous reactants at greater than room temperature (25° C. to 600° C.), wherein a solid product of the reaction is deposited on the surface on which a film, coating, or layer of the solid product is to be formed. The first dielectric layer 26 may include an oxide, nitride or oxynitride material. In one embodiment, the first dielectric layer 26 may be composed of silicon nitride (SiN) having a thickness ranging from 10 nm to 300 nm.

Following formation of the first dielectric layer 26, an etch mask, e.g., photoresist mask 27, is formed overlying the first dielectric layer 26 using deposition and photolithography. For example, the etch mask may be provided by patterning a photoresist layer. The steps of patterning a photoresist layer may include applying a photoresist to the first dielectric layer 26 and then exposing the photoresist layer to a pattern of radiation to protect a portion of the first dielectric layer 26, and a portion of the layer of the first phase change material 20, that is overlying a portion of the second electrode 10. In a following step, the pattern is developed into the exposed photoresist layer utilizing a resist developer to provide a patterned photoresist mask 27 (hereafter referred to as photoresist mask 27) that protects a portion of the first dielectric layer 26 that is overlying at least a portion of the second electrode 10. In a different embodiment, a hard mask material such as a metal or a dielectric may be used as an etch mask.

Figure 4:
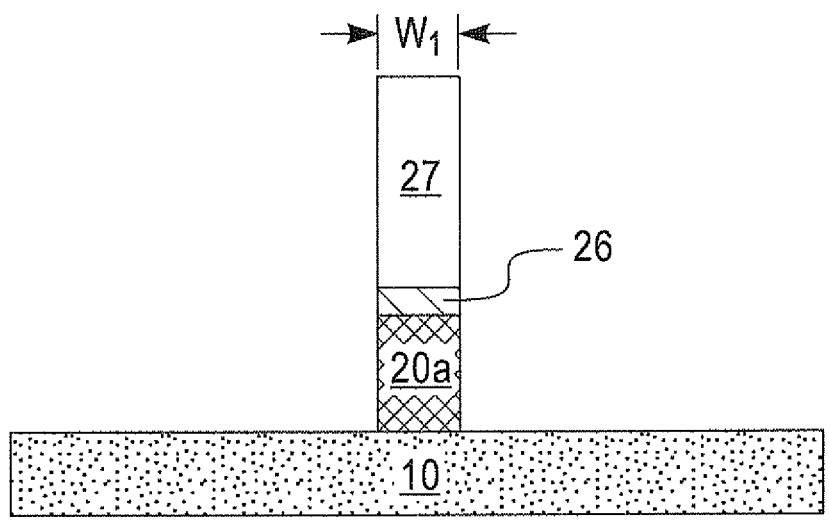
FIG. 4 is a side cross-sectional view depicting patterning the photoresist, etching the layer of the first dielectric material using the patterned photoresist layer as an etch mask, and etching the layer of the first phase change material to provide a pillar of the first phase change material overlying the first electrically conductive material in the substrate, in accordance with one embodiment of the present invention.

Referring to FIG. 4, in a following process step, a portion of the layer of the first phase change material 20 is removed to provide a pillar of the first phase change material 20a. In one embodiment, following the formation of the photoresist mask 27, the exposed portions of the first dielectric layer and the layer of the first phase change material 20 are etched using an anisotropic etch process, e.g., reactive ion etching, selective to the second electrode 10. As used herein, an "anisotropic etch process" denotes a material removal process in which the etch rate in the direction normal to the surface to be etched is greater than in the direction parallel to the surface to be etched. Reactive Ion Etching (RIE) is a form of plasma etching, in which during etching the surface to be etched is placed on the RF powered electrode, wherein the surface to be etched takes on a potential that accelerates the etching species extracted from a plasma toward the surface to be etched, in which the chemical etching reaction is taking place in the direction normal to the surface.

In one embodiment, when the second electrode 10 is composed of titanium nitride (TiN), the layer of the first phase change material 20 is composed of GST, and the layer of the first dielectric layer 26 is composed of silicon nitride (SiN), etching the first dielectric layer 26 includes a reactive ion etch process including a fluorocarbon containing plasma chemistry. In another embodiment, the fluorocarbon feed gas chemistry used in the RIE process may contain $CF_4$, $CHF_3$, $C4F_8$, $C5F_8$ or $C_4F_6$. Following etch of the layer of the first phase change material 20, the photoresist mask 27 is removed using a chemical strip or oxygen ashing.

The above-described etch process may be practiced using a two-stage etch that includes utilizing the photoresist mask 27 to etch the first dielectric layer 26, removing the photoresist mask 27, and then etching the layer of the first phase change material 20 using the etched first dielectric layer 26 as an etch mask.

Still referring to FIG. 4, etching the layer of the first phase change material 20 provides a pillar 20a of the first phase change material having dimensions dictated by the photoresist mask 27. In one embodiment, the width $W_1$ of the pillar 20a is less than 100 nm. In another embodiment, the width $W_1$ of the pillar 20a ranges from 30 nm to 80 nm. In a further embodiment, the width $W_1$ of the pillar 20a ranges from 10 nm to 50 nm.

Figure 5:
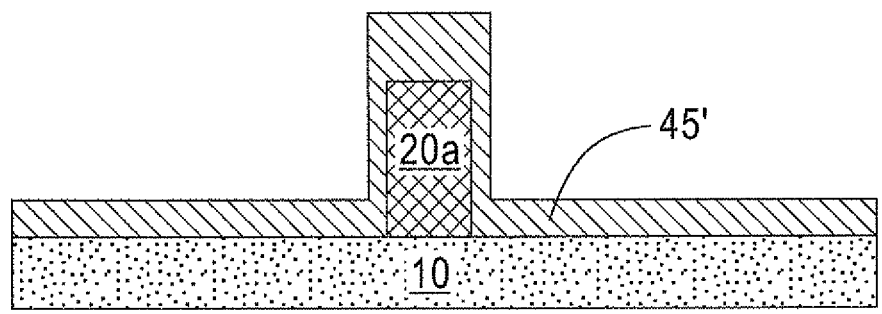
FIG. 5 is a side cross-sectional view depicting one embodiment of depositing a second dielectric layer on the exterior surface of the pillar of the first phase change material, in accordance with the present invention.
Figure 6:
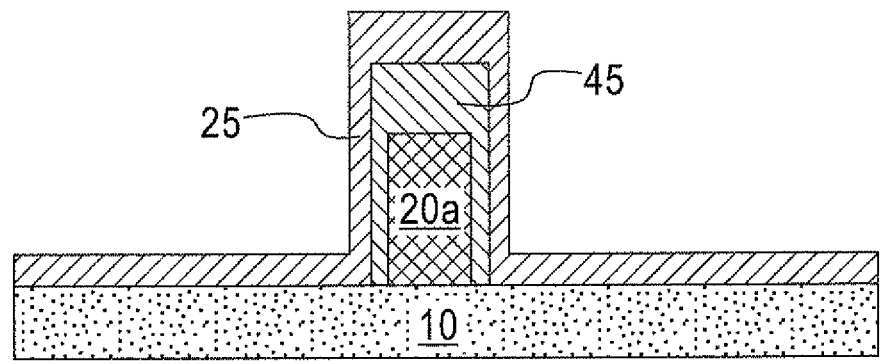
FIG. 6 is a side cross-sectional view depicting etching the layer of the second dielectric material to form dielectric spacers abutting the sidewalls of the pillar of the first phase change material, and depositing a layer of a second phase change material overlying the pillar of the first phase change material, in accordance with the present invention.

Referring to FIGS. 5 and 6, following the formation of the pillar of the first phase change material 20a, a dielectric spacer 45 is formed abutting a sidewall of the pillar of the first phase change material 20a. The dielectric spacer 45 may include a dielectric such as a nitride, oxide, oxynitride, or a combination thereof. In one embodiment, the dielectric spacer 45 may be composed of silicon nitride (SiN). The dielectric spacer 45 may be formed using deposition, photolithography and etch processes.

Formation of the dielectric spacer 45 may begin with depositing a second dielectric layer 45' on at least an exterior surface of the pillar of the first phase change material 20a. In one embodiment, the second dielectric layer 45' is formed atop the pillar of the first phase change material 20a by a deposition process including, for example, chemical vapor deposition (CVD), plasma-assisted CVD, evaporation, spin-on coating, or chemical solution deposition. In another embodiment, the second dielectric layer 45' is formed using a growth process, such as thermal growth, e.g., thermal oxidation or thermal nitridation. The second dielectric layer 45' may be formed using a conformal deposition process. The term "conformal layer" denotes a layer having a thickness that does not deviate from greater than or less than 40% of an average value for the thickness of the layer.

Following deposition of the second dielectric layer 45', the second dielectric layer 45' is etched to provide a dielectric spacer 45 that is positioned abutting the sidewalls of the pillar of the first phase change material 20a and atop the upper surface of the first phase change material 20a, as depicted in FIG. 6. In one embodiment, the dielectric spacer 45 is formed from the second dielectric layer 45' using a substantially horizontal anisotropic etch. In one embodiment, when the second dielectric layer 45 is composed of silicon nitride (SiN) and the second electrode 10 is composed of titanium nitride (TiN) the etch chemistry is composed of CF4, $CHF_3$, $C4F_8$, $C5F_8$ or $C_4F$. The width of the dielectric spacer 45, as measured from the sidewall of the pillar of the first phase change material 20a ranges from about 1 nm to about 10 nm. It is noted that in some embodiments of the invention, the dielectric spacer 45 is optional, and may be omitted from the structures disclosed herein.

Still referring to FIG. 6, in a following process step, in one embodiment, a layer of a second phase change material 25 is then deposited atop the vertical (also referred to as sidewalls) and horizontal surfaces (also referred to as upper surface) of the dielectric spacer 45. In one embodiment, in which the dielectric spacer 45 is omitted, the layer of a second phase change material 25 is deposited atop the vertical (also referred to as sidewalls) and horizontal surfaces (also referred to as upper surface) of the pillar of the first phase change material 20a. In this embodiment, the layer of the second phase change material 25 is in direct physical contact with the pillar of the first phase change material 20a.

In one embodiment, the layer of the second phase change material 25 is deposited overlying the pillar of the first phase change material 20a to provide a memory cell composed of two phase change materials. In one embodiment, the layer of the second phase change material 25 has a higher crystallization temperature than the layer of the first phase change material 20a. The higher crystallization temperature of the layer of the second phase change material 25 may be provided by doping the second phase change material with a dopant including, but not limited to: oxygen, nitrogen, silicon, silicon oxide, silicon nitride or a combination thereof. The dopant may be present in a weight percent ranging from about greater than 1.0 wt % to about 10 wt %. The dopant may be introduced in situ during the formation of the layer of the second phase change material 25 or may be implanted into the layer of the second phase change material 25 following formation via ion implantation.

The layer of the second phase change material 25 may be switched from an amorphous phase to a crystalline phase. When in an amorphous state, the layer of the second phase change material 25 exhibits a high resistivity. In one embodiment, the resistivity of the second phase change material ranges from about $10^2$ ohm-m to about $10^4$ ohm-m. When in a crystalline state, the layer of the second phase change material 25 is more conductive, exhibiting a lower resistivity by a factor of 10-10000. The layer of the second phase change material 25 may comprise chalcogenide alloys. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the second phase change material has a composition of $Ge_2Sb_2Te_5$ (GST). Although chalcogenides are a group of materials commonly utilized as phase change material, some phase change materials, such as GeSb, do not utilize, chalcogenides. Thus, a variety of materials can be used in a phase change material cell as long as they can retain separate amorphous and crystalline states of distinct resistivity.

In one embodiment, the layer of the second phase change material 25 has a crystallization temperature ranging from 230° C. to 350° C. In one embodiment, the layer of the second phase change material 25 has a crystallization temperature ranging from 240° C. to 280° C. In an even further embodiment, the crystallization temperature of the layer of the second phase change material 25 ranges from 240° C. to 260° C. In one embodiment, the second phase change material 25 has a crystallization temperature ranging from 200° C. to 300° C. and a crystallization time ranging from 100 nanoseconds to 1000 nanoseconds.

In one embodiment, the layer of the second phase change material 25 composed of GeSb when at a temperature of about 20° C. is in an amorphous phase. As the temperature of the GeSb phase change material is increased to a temperature ranging from 240° C. to 270° C., i.e., raised to the crystallization temperature, the resistivity of the phase change material decreases representing the transition temperature for a phase change from an amorphous phase to the crystalline phase. When the temperature of the GST phase change material is increased above the melting temperature (approximately 600° C.), the GST phase change material melts and upon quench returns to the amorphous solid phase. Quench denotes solidification in a time period ranging from 0.5 nanoseconds to 50 nanoseconds.

The layer of the second phase change material 25 may be a substantially conformal layer. The term "conformal layer" denotes a layer having a thickness that does not deviate from greater than or less than 40% of an average value for the thickness of the layer. The layer of the second phase change material 25 may be deposited by physical vapor deposition or chemical vapor deposition. Variations of CVD processes include, but are not limited to, Atmospheric Pressure CVD (APCVD), Low Pressure CVD (LPCVD), Plasma Enhanced CVD (EPCVD), Metal-Organic CVD (MOCVD), Atomic Layer Deposition (ALD) and combinations thereof may also be employed.

In one embodiment, the thickness of the layer of the second phase change material 25 may range from 15 nm to 400 nm. In another embodiment, the thickness of the layer of the second phase change material 25 may range from 20 nm to 100 nm.

In one embodiment, the layer of the second phase change material 25 is blanket deposited and then etched so that a remaining portion of the second phase change material is present only on the exterior surface of the dielectric spacer 45 and the pillar of the first phase change material 20a. In one embodiment, a photoresist mask (not shown) is formed atop the blanket layer of the second phase change material 25, the photoresist mask protecting the portion of the layer of the second phase change material that is present on the exterior surface of the dielectric spacers 45 and the exterior surface of the pillar of the first phase change material 20a, wherein a remaining portion of the layer of the second phase change material 25 is exposed. In one embodiment, the exposed portion of the layer of the second phase change material 25 is removed by an etch process that removes the layer of the second phase change material 25 selective to the second electrode 10. In one embodiment, the exposed portion of the layer of the second phase change material 25 is removed by an anisotropic etch step, such as reactive ion etch in a $Cl_2/Ar/CHF_3$ based etch chemistry.

Figure 7:
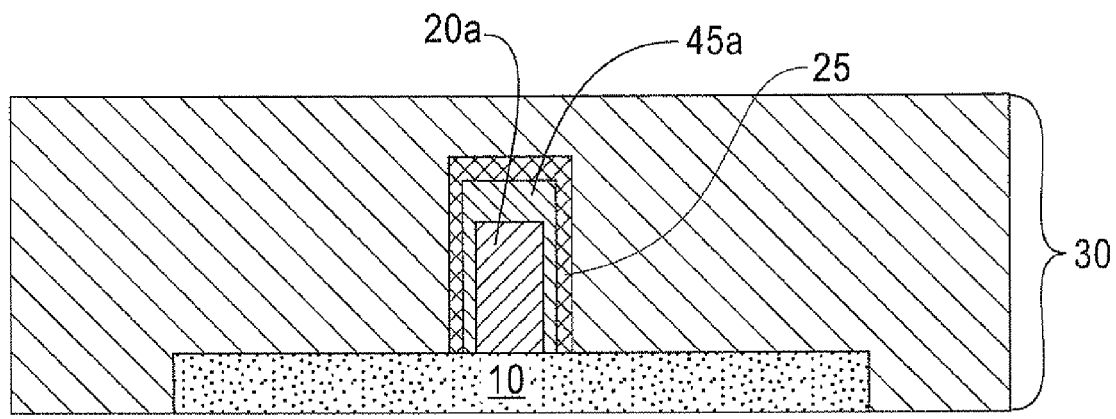
FIG. 7 is a side cross-sectional view depicting depositing a layer of a third dielectric material, in accordance with the present invention.

Referring to FIG. 7, in a following process step, a third dielectric layer 30 is formed atop the structure depicted in FIG. 6 using a deposition process. In one embodiment, the deposition process includes chemical vapor deposition (CVD). Variations of CVD processes include, but are not limited to, Atmospheric Pressure CVD (APCVD), Low Pressure CVD (LPCVD), Plasma Enhanced CVD (EPCVD), Metal-Organic CVD (MOCVD) and combinations thereof may also be employed. In one embodiment, the chemical vapor deposition (CVD) process may be high density plasma chemical vapor deposition.

The third dielectric layer 30 includes any suitable insulating material that is typically employed in the areas of interconnects to electrical devices, memory devices, and/or semiconductor devices. This includes inorganic dielectrics, organic dielectrics and combinations thereof, including, multilayers thereof. Illustrative examples of suitable materials for the third dielectric layer 30 include, but are not limited to: $SiO_2$, Boron Phosphor Silicate Glass (BPSG) oxide, fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H.

In one embodiment, the layer of the third dielectric layer 30 is composed of a low-k dielectric having a thickness ranging from 10 nm to 1000 nm. In another embodiment, the third dielectric layer 30 has a thickness on the order of about 300 nm. In one embodiment, the dielectric constant of the third dielectric layer 30 may be less than about 3.5. In another embodiment, the third dielectric layer 30 may have a dielectric constant that ranges from 1.0 to 3.0. Low-k dielectrics may include organic dielectrics such as low dielectric constant polymer dielectrics or may include low dielectric constant carbon-doped oxides. One example of a low-k dielectric polymer dielectric is SiLK™. Specifically, SiLK™ is a class of polymer-based low-k dielectric materials comprising a b-staged polymer having a composition including about 95% carbon. An example of a low dielectric constant carbon doped oxide is SiCOH.

Figure 8:
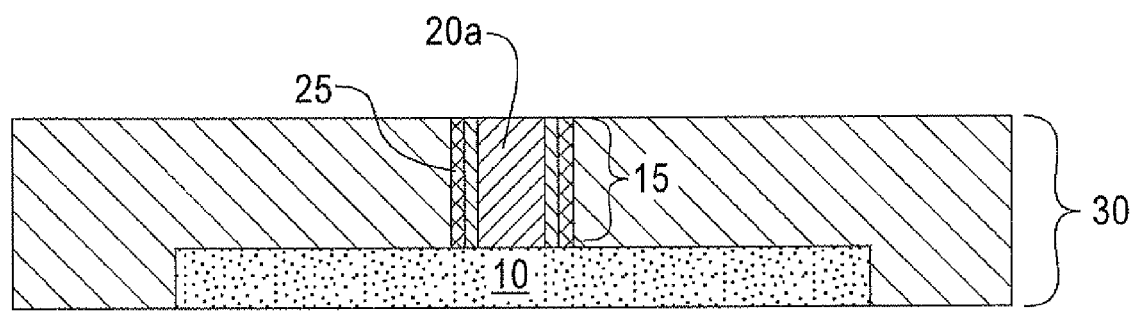
FIG. 8 is a side cross-sectional view depicting one embodiment of a planarization step to provide a planar upper surface, in accordance with the present invention.

FIG. 8 depicts one embodiment of a planarization process to expose provide a planar upper surface, wherein an upper surface of the second phase change material 25 is coplanar with an upper surface of the dielectric spacer 45, and an upper surface of the first phase change material 20a, in accordance with the present invention. As used herein, "planarization" is a material removal process that employs at least mechanical forces, such as frictional media, to produce a planar surface. In one embodiment, the planarization process includes chemical mechanical planarization (CMP). "Chemical Mechanical Planarization" is a material removal process using both chemical reactions and mechanical forces to remove material and planarize a surface. The planarization process is continued until at least an upper surface of the pillar of the first phase change material 20a and an upper surface of the second phase change material 25 are exposed.

In a following process sequence, the first electrode 5 may then be formed atop the exposed surface of the pillar of the first phase change material 20a and the exposed surface of the layer of the second phase change material 25, as depicted in FIG. 1. In one embodiment, the first electrode 5 is in electrical communication with the exposed surface of the pillar of the first phase change material 20a and the exposed surface of the layer of the second phase change material 25. In one embodiment, the exposed surface of the pillar of the first phase change material 20a and the exposed surface of the layer of the second phase change material 25 is in direct physical contact with a metal stud 35 of the first electrode 5. In another embodiment, the exposed surface of the pillar of the first phase change material 20a and the exposed surface of the layer of the second phase change material 25 is in direct contact with a metal nitride liner 40. In an even further embodiment, the exposed surface of the pillar of the first phase change material 20a and the exposed surface of the layer of the second phase change material 25 is in direct physical contact with an electrically conductive pad 50.

The first electrode 5 may be formed within a via 60 (also referred to as openings) formed through a fourth dielectric layer 55. In one prior to forming the fourth dielectric layer 55, the electrically conductive pad 50 is formed atop the exposed surface of the pillar of the first phase change material 20a and the exposed surface of the layer of the second phase change material 25.

In one embodiment the electrically conductive pad 50 is TiN, TaN or a combination thereof. The electrically conductive pad 50 is blanket deposited by a physical deposition process, such as sputtering. In another embodiment, the electrically conductive pad 50 may be deposited by chemical vapor deposition. The layer of electrically conductive pad 50 may have a thickness ranging from about 20 nm to about 200 nm. Following deposition, the electrically conductive pad 50 is patterned and etched to correspond to the underlying memory cell.

Following the formation of the electrically conductive pad 50, the fourth dielectric layer 55 may be formed atop the electrically conductive pad 50 and the third dielectric layer 30 using deposition, etching and planarization. More specifically, in one embodiment of the invention, the fourth dielectric layer 55 is formed by a deposition process including, for example, chemical vapor deposition (CVD), plasma-assisted CVD, evaporation, spin-on coating, or chemical solution deposition. The fourth dielectric layer 55 includes any suitable insulating material that is typically employed in interconnects to electrical devices. This includes inorganic dielectrics, organic dielectrics and combinations thereof, including, multilayers thereof. Illustrative examples of suitable materials for fourth dielectric layer 55 include, but are not limited to: $SiO_2$, Boron Phospho Silicate Glass (BPSG) oxide, fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H. In one embodiment, the fourth dielectric layer 55 includes a thickness ranging from 10 nm to 1000 nm. In another embodiment, the fourth dielectric layer 55 has a thickness on the order of about 300 nm After forming the fourth dielectric layer 55, openings 60 are formed into the fourth dielectric layer 55 so as to expose portions of the underlying electrically conductive pad 50, in which device interconnects, such as metal studs 35 and/or metal bars are subsequently formed. The openings 60, also referred to as vias 60, are formed utilizing conventional lithography and etching. For example, the lithographic step may include applying a photoresist to the fourth dielectric layer 55, exposing the photoresist to a pattern of radiation and developing the pattern into the exposed photoresist utilizing a resist developer. The etching step used in providing the vias 60 into the fourth dielectric layer 55 includes chemical reactive ion etching (RIE), plasma etching, ion beam etching or laser ablation. Following etching, the photoresist is typically removed from the structure utilizing a resist stripping process, such as oxygen ashing.

In one embodiment, device interconnects, such as metal studs 35 and metal bars, are then formed within the vias 60 in the fourth dielectric layer 55 using deposition and planarization processes. The electrically conductive liner 40, also referred to as metal nitride liner 40, may be positioned between the device interconnects' via sidewalls, and the upper surface of the underlying electrically conductive pad 50.

The electrically conductive liner 40 may be deposited atop the horizontal and vertical surfaces of the via 60 within the fourth dielectric layer 55 including the exposed upper surface of the electrically conductive pad 50 to provide electrical contacts, i.e., a first electrode 5, to the memory cell positioned thereunder. The electrically conductive liner 40 may be a barrier metal. The electrically conductive liner 40 may be a substantially conformal layer. In one embodiment, the electrically conductive liner 40 may comprise TiN or TaN. In one embodiment, the electrically conductive liner 40 may have a thickness ranging from 1 nm to 50 nm. The electrically conductive liner 40 may have a thickness on the order of about 10 nm. In one embodiment, the electrically conductive liner 40 may be deposited by sputter deposition. In another embodiment, the electrically conductive liner 40 may be deposited by chemical vapor deposition.

Following the formation of the electrically conductive liner 40, a conductive material, such as Cu or W, is then formed utilizing a conventional deposition process, such as plating or sputtering, filling at least the vias 60 to provide a metal stud 35. After filling the vias 60 with a conductive material, the structure is typically subjected to a planarization process, such as chemical-mechanical polishing or grinding, to provide a planar structure, as depicted in FIG. 1.

Figure 9:
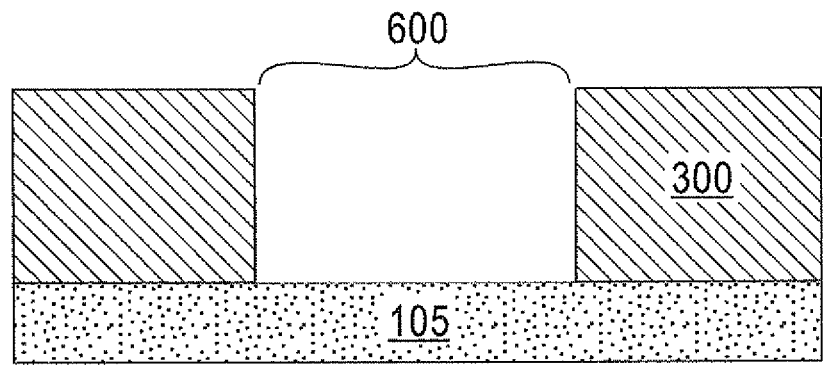
FIG. 9 is a side cross-sectional view of a process sequence for the initial steps of a method for producing a memory device that includes providing a first dielectric layer overlying a substrate including a first electrically conductive material, and forming an opening in the first dielectric layer to expose a portion of the first electrically conductive material in the substrate, in accordance with one embodiment of the present invention.
Figure 10:
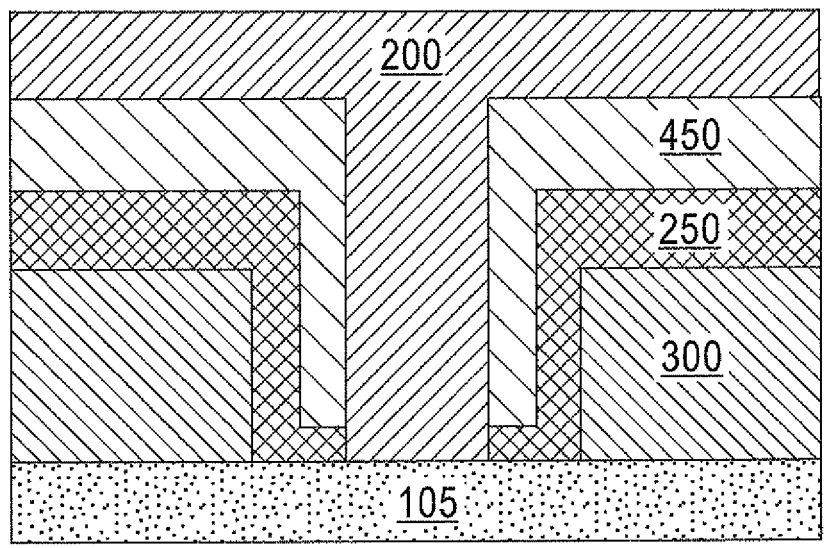
FIG. 10 is a side cross-sectional view depicting a process sequence that includes forming a layer of a first phase change material on the first dielectric layer and on the sidewalls of the first dielectric layer within the opening through the first dielectric layer, depositing a second dielectric layer on the layer of the first phase change material, etching the first phase change material, and filling the opening in the second dielectric layer with a second phase change material, in accordance with one embodiment of the present invention.
Figure 11:
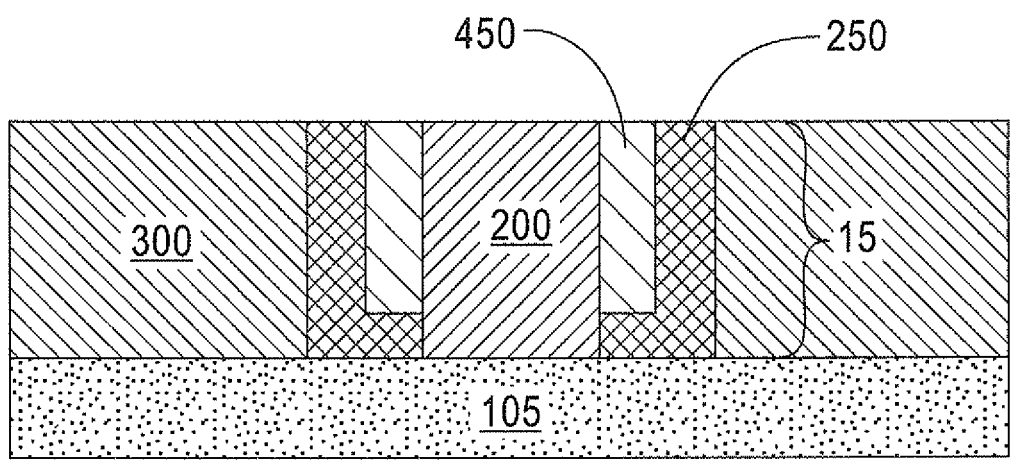
FIG. 11 is a side cross sectional view depicting planarizing to provide a planar upper surface, in accordance with one embodiment of the present invention.

Another embodiment of the inventive method is depicted in FIGS. 9-11, which may be utilized to provide the structure depicted in FIG. 2 or a structure similar to FIG. 2. In one embodiment, the inventive method of forming a memory device 110 includes at least the steps of providing a first dielectric layer 300 overlying a substrate including a first electrically conductive material (hereafter referred to as a second electrode 105) and forming an opening 600 in the first dielectric layer 300 to expose a portion of the second electrode 105. Thereafter, a layer of a first phase change material 250 is formed on the first dielectric layer 300 and on the sidewalls of the first dielectric layer 300 within the opening 600. Following the formation of the layer of the first phase change material 250, the opening 600 is then filled with a second phase change material 200.

As opposed to the method described above with reference to FIGS. 2-8, which forms a memory cell 151 of pillar configuration that is then enclosed in a dielectric material, the method depicted in FIGS. 9-11 forms a dielectric layer 300 first, and then forms the memory cell 115 within a via 600 formed in the dielectric layer 300.

FIG. 9 depicts a process sequence for the initial steps for producing a memory device 110 similar to that depicted in FIG. 2. The initial steps of the method include providing a first dielectric layer 300 overlying a substrate comprising a first electrically conductive material 105 (hereafter referred to as second electrode 105), and forming an opening 600 in the first dielectric layer 300 to expose a portion of the second electrode 105 in the substrate.

The first dielectric layer 300 includes any suitable insulating material that is typically employed in the areas of interconnects to electrical devices, memory devices, and/or semiconductor devices. The first dielectric layer 300 is similar to the third dielectric layer 30 described above with reference to FIGS. 1 and 3-8. Therefore, the dimensions and compositions for the third dielectric layer 30 described above are suitable for the first dielectric layer 300 of the embodiments of the invention that are described with reference to FIGS. 2 and 9-11.

After forming the first dielectric layer 300, openings 600 are formed into the first dielectric layer 300 so as to expose portions of the underlying second electrode 105. The openings 600, hereafter referred to as vias, are formed utilizing conventional lithography and etching. For example, the lithographic step may include applying a photoresist to the first dielectric layer 300, exposing the photoresist to a pattern of radiation and developing the pattern into the exposed photoresist utilizing a resist developer. The etching step used in providing the vias 600 into first dielectric layer 300 includes chemical reactive ion etching (RIE), plasma etching, ion beam etching or laser ablation. In one embodiment, the width of the vias 600 ranges from 10 nm to 150 nm. Following etching, the photoresist is typically removed from the structure utilizing a resist stripping process, such as oxygen ashing.

FIG. 10 depicts forming a layer of a second phase change material 250 on the first dielectric layer 300 and on sidewalls of the first dielectric layer 300 within the opening 600, depositing a second dielectric layer 450 on the layer of the second phase change material 250, etching the second dielectric material layer 450, and filling the opening with a first phase change material 200, in accordance with one embodiment of the present invention. The layer of the second phase change material 250 is similar to the layer of the second phase change material 25 described above with reference to FIGS. 1 and 3-8. Therefore, the compositions for the layer of the second phase change material 25 described above are suitable for the layer of the second phase change material 250 of the present embodiment. The first phase change material 200 is similar to the material of the pillar of the first phase change material 20*a* described above with reference to FIGS. 1 and 3-8. Therefore, the compositions for the pillar of the first phase change material 20*a* described above are suitable for the description of the first phase change material 200 of the present embodiment. In one embodiment, the layer of the second phase change material 250 has a higher crystallization temperature than the first phase change material 200.

In one embodiment, the recess etch forming the second dielectric material spacer covering the sidewalls of the layer of a second phase change material 250 is endpointed at the upper surface of the second electrode 105. In another embodiment, the recess etch forming the second dielectric material spacer covering the sidewalls of the layer of a second phase change material 250 is endpointed within the layer of the second phase change material 250. In yet another embodiment, the recess etch forming the second dielectric material spacer covering the sidewalls of the layer of a second phase change material 250 is endpointed at the top of the layer of the second phase change material 250.

The layer of the second phase change material 250 may be deposited using chemical vapor deposition. In one embodiment, the second phase change material 250 is deposited using a conformal deposition process, such as plasma enhanced chemical vapor deposition. The second phase change material 250 has a thickness ranging from 10 nm to 400 nm. In another embodiment, the second phase change material 250 has a thickness ranging from 20 nm to 100 nm.

Following the deposition of the second phase change material 250, the method may further include forming a second dielectric layer 450 on the layer of the second phase change material 250 overlying the substrate and on the layer of the second phase change material 250 on the sidewalls of the first dielectric layer 300 within the opening 600. The second dielectric layer 450 is similar to the second dielectric layer described above with reference to FIGS. 1 and 3-8. Therefore, the compositions for the second dielectric layer 45 described above are suitable for the second dielectric layer 450 of the present embodiment. It is noted that the second dielectric layer 450 is optional and embodiments have been contemplated in which the second dielectric layer 450 is omitted.

In one embodiment, the second dielectric layer 450 is a substantially conformal layer. In one embodiment, the second dielectric layer 450 may have a thickness ranging from 2 nm to 5 nm. In another embodiment, the second dielectric layer 450 may have a thickness on the order of about 10 nm. In one embodiment, a conformal deposition process, such as plasma enhanced chemical vapor deposition, may deposit the second dielectric layer 450.

Following the formation of the second dielectric layer 450 on the layer of the second phase change material 250, an etch processes exposes a portion of the second electrode 105 at the base of the opening 600. In one embodiment, it is not required that the upper surface of the second electrode 105 be exposed. In one embodiment, a remaining portion of the second dielectric layer 450 may be present atop the second electrode 105 having a thickness ranging from 1 nm to 5 nm.

In a following process step, the openings 600 are filled with the first phase change material 200. In one embodiment, the first phase change material 200 is deposited using a chemical vapor deposition (CVD) process. In a different embodiment, an atomic layer deposition process (ALD) is used. The first phase change material 200 is in direct physical contact with the second phase change material 250. Following the filling of the opening 600 with the first phase change material 200, the first phase change material 200 may be planarized to provide a planar upper surface, wherein an upper surface of the second phase change material 250 is coplanar with an upper surface of the second dielectric layer 450, the upper surface of the first dielectric layer 300, and an upper surface of the first phase change material 200, as depicted in FIG. 11.

In a following process sequence, a first electrode 101 is then formed atop the upper surface of the structure depicted in FIG. 11. The first electrode 101 and the process sequence for forming the first electrode 101 is similar to the materials and methods that are used for forming the first electrode 5 described above with reference to FIGS. 1 and 3-8. Therefore, the materials and methods for the first electrode 5 described above are suitable for the description of first electrode 101 of the present embodiment.

FIGS. 12a and 12b are plots describing the mode of operation of one embodiment of a memory cell 15 including two-phase change materials. In one embodiment, the present invention provides a memory cell that is capable of sustaining more than two resistance states. FIGS. 12a and 12b depict a memory cell 15 in which the core of the first phase change material and the cladding of the second phase change material have been configured to provide three resistivity states, wherein the crystallization temperature of the cladding is greater than the core. In one embodiment, the dimensions of the cladding phase change material and the core phase change material are selected to provide a core to cladding footprint area ratio that is approximately the inverse of the ratio of the resistivity of the core of the first phase change material to the resistivity of the cladding of the second phase change material. In a different embodiment, the crystallization speed of the core phase change material, which is proportional to the inverse of the minimum time required for crystallization, is higher than of the cladding phase change material.

In one embodiment, when the core and the cladding are both in the amorphous state, the resistance of the device is high and the read current is low as indicated by the reference lines labeled STATE 1 in FIGS. 12a and 12b. To provide a state in which the core and the cladding are both amorphous, an energy pulse of high amplitude, e.g., an energy pulse having an amplitude greater than 1.5 mW, and short duration, e.g., a duration of less than about 100 nanoseconds, is applied to the electrodes of the memory device. In one embodiment, the energy pulse has an amplitude of 2.0 mW and has a duration of 50 nanoseconds. The trailing edge of this energy pulse is chosen to be very short, e.g. less than 1 nanosecond, such that both cladding and core phase change materials are first molten and then melt quenched into the amorphous state. In one embodiment, the trailing edge of this energy pulse has a duration of 500 picoseconds.

In one embodiment, when the core is crystalline and the cladding is amorphous, the resistance of the device is lesser than STATE 1 and the read current of the device is greater than STATE 1, as indicated by the reference lines labeled STATE 2 in FIGS. 12a and 12b. To provide a state in which the core is crystalline and the cladding is amorphous, a first energy pulse of high amplitude, e.g., greater than 1.5 mW, and short duration, e.g., less than 100 nanoseconds, is applied to the electrodes of the memory device. In one embodiment, the first energy pulse has an amplitude of 2.0 mW and has a duration of 50 nanoseconds. The trailing edge of this pulse is chosen to be very short, e.g., less than 1 nanosecond, such that both cladding and core phase change materials are first molten and then melt quenched into the amorphous state. In one embodiment, the trailing edge of this energy pulse has a duration of 500 picoseconds. Subsequently, a second energy pulse of low amplitude, e.g., less than 0.5 mW, and moderate duration, e.g., from 100 nanoseconds to 500 nanoseconds, is applied to the electrodes of the memory device, which provides sufficient heating to the core of the first phase change material for a phase change from the amorphous state to a crystalline state, i.e, crystallization, but insufficient heating to the cladding of the second phase change material to convert the amorphous cladding to a crystalline state. In a different embodiment, the second energy pulse is provided by a high amplitude pulse that ranges from 1.5 mW to 2.0 mW with a medium trailing edge, e.g., ranging from 1 nanosecond to less than 100 nanoseconds, which ensures that only the core of the first phase change material is heated to its crystallization temperature within the time period of 100 nanoseconds or less.

In one embodiment, when the core and the cladding are both crystalline, the resistance of the device is lesser than STATE 2 and the read current of the device is greater than STATE 2, as indicated by the reference lines labeled STATE 3 in FIGS. 12a and 12b. To provide a state in which the core and the cladding are both crystalline, an energy pulse of moderate amplitude, e.g., from 0.5 mW to 1.5 mW, and long duration, e.g., greater than 500 nanoseconds, is applied to the electrodes of the memory device.

In a different embodiment, a higher amplitude pulse, e.g., about 1.8 mW, is used with a long trailing edge, e.g., greater than 100 nanoseconds, which ensures that all regions of the two phase change materials meet their optimum temperature for crystallization within 100 nanoseconds.

FIGS. 13a and 13b are plots describing the mode of operation of another embodiment of a memory cell 15 including two-phase change materials. In one embodiment, the present invention provides a memory cell that is capable of sustaining more than two resistance states. FIGS. 13a and 13b depict a memory cell 15 in which the core of the first phase change material and the cladding of the second phase change material have been configured to provide four resistivity states, wherein the crystallization temperature of the cladding of the second phase change material is greater than the crystallization temperature of the core of the first phase change material. In a different embodiment, the crystallization speed, which is proportional to the minimum time for crystallization, of the core of the first phase change material is higher than of the cladding of the second phase change material.

In one embodiment, the dimensions of the cladding of the second phase change material and the core of the first phase change material are selected to provide a core to cladding footprint area ratio is approximately twice the inverse of the ratio of resistivity of the core of the first phase change material to the resistivity of the cladding of the second phase change material. This allows for approximately equidistant spacing of the resistance levels and maximizes the read margin.

In one embodiment, when the core of the first phase change material and the cladding of the second phase change material are both in the amorphous state the resistance of the device is high and the read current is low as indicated by the reference lines labeled STATE 1 in FIGS. 13a and 13b. To provide a state in which the core of the first phase change material and the cladding of the second phase change material are both amorphous an energy pulse of high amplitude, e.g., greater than 1.5 mW, and short duration, e.g., less than 100 nanoseconds, is applied to the electrodes of the memory device. In one embodiment, the amplitude of the energy pulse is greater than 2.0 mW and the duration of the energy pulse is 50 nanoseconds. The trailing edge of this pulse is chosen to be very short, e.g. less than 1 nanosecond, such that both the cladding of the second phase change material and core of the first phase change materials are first molten and then melt quenched into the amorphous state. In one embodiment, the trailing edge of the energy pulse has a duration of 500 picoseconds.

In one embodiment, when the core of the first phase change material is amorphous and the cladding of the second phase change material is crystalline, the resistance of the device is lesser than STATE 1 and the read current of the device is greater than STATE 1, as indicated by the reference lines labeled STATE 2 in FIGS. 13a and 13b. To provide a state in which the core of the first phase change material is amorphous and the cladding of the second phase change material is crystalline, a first energy pulse of moderate amplitude, e.g., from about 0.5 mW to about 1.5 mW, and long duration, e.g., equal to or greater than 500 nanoseconds, is applied to the electrodes of the memory device, which crystallizes both the core of the first phase change material and the cladding of the second phase change material. Subsequently, an energy pulse having an amplitude of about 1.2 mW, and a duration of about 50 nanoseconds is applied to the electrodes of the memory device. This pulse is capable of melting the core phase change material, but not the cladding phase change material. The trailing edge of this pulse is chosen to be very short, e.g., less than 1 nanosecond, such that a crystalline core of the first phase change material is melted and quenched into an amorphous state, while the cladding of the second phase change material remains in the crystalline state. In one embodiment, the trailing edge of the energy pulse has a duration of 500 picoseconds.

In one embodiment, when the core of the first phase change material is crystalline and the cladding of the second phase change material is amorphous, the resistance of the device is lesser than STATE 1 and the read current of the device is greater than STATE 1, as indicated by the reference lines labeled STATE 2 in FIGS. 13a and 13b. To provide a state in which the core of the first phase change material is crystalline and the cladding of the second phase change material is amorphous, a first energy pulse of high amplitude, e.g., greater than 1.5 mW, and short duration, e.g., less than 100 nanoseconds, is applied to the electrodes of the memory device. In one embodiment, the first energy pulse has an amplitude greater than 2.0 mW and has a duration of 50 nanoseconds. The trailing edge of this energy pulse is chosen to be very short, e.g., less than 1.0 nanosecond, such that both the cladding of the second phase change material and core of the first phase change material are first molten and then melt quenched into the amorphous state. Subsequently, a second energy pulse of low amplitude, e.g., less than 0.5 mW, and moderate duration, e.g., ranging from 100 nanoseconds to 200 nanoseconds, is applied to the electrodes of the memory device, which provides sufficient heating to the core of the first phase change material to effectuate a phase change from an amorphous state to a crystalline state, i.e., crystallization, but is insufficient heating to crystallize the amorphous cladding of the second phase change material. In one embodiment, the second energy pulse has an amplitude of 0.4 mW and a duration of 200 nanoseconds. In a different embodiment, the second energy pulse is provided by a high amplitude pulse that ranges from 1.5 mW to 2.0 mW with a medium trailing edge, e.g., ranging from 1 nanosecond to less than 100 nanoseconds, which ensures that only the core of the first phase change material is heated to its crystallization temperature for a sufficient crystallization time period.

In one embodiment, when the core of the first phase change material and the cladding of the second phase change material are both crystalline, the resistance of the device is lesser than STATE 3 and the read current of the device is greater than STATE 3, as indicated by the reference lines labeled STATE 4 in FIGS. 13a and 13b. To provide a state in which the core of the first phase change material and the cladding of the second phase change material are both crystalline an energy pulse of moderate amplitude, e.g., ranging from 0.5 mW to 1.5 mW, and long duration, e.g., equal to or greater than 500 nanoseconds, is applied to the electrodes of the memory device. In one embodiment, the amplitude of the energy pulse is equal to 0.7 mW and the duration is equal to 500 nanoseconds. In another embodiment, a higher amplitude pulse, e.g., greater than 1.5 mW, is used with a long trailing edge, e.g., equal to or greater than 500 nanoseconds, which ensures that all regions of the core of the first phase change material and the cladding of the second phase change material meet their optimum temperature for crystallization within 500 nanoseconds.

The above pulse conditions are provided for illustrative purposes only and are not intended to limit the invention. Depending on the phase change materials and dimensions other amplitudes and durations may be employed within the scope of this application.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A method of forming a memory device comprising:
forming a pillar of a first phase change material atop a substrate, the substrate comprising a first electrically conductive material, the first phase change material is in electrical communication with the first electrically conductive material;
forming a dielectric spacer overlying the pillar of the first phase change material, wherein the dielectric spacer is positioned atop and in direct physical contact with an upper surface of the pillar of the first phase change material, and is abutting a sidewall of the pillar of the first phase change material;
forming a layer of a second phase change material overlying the pillar of the first phase change material; and
planarizing to provide a planar upper surface, wherein an upper surface of the second phase change material is coplanar with an upper surface of the dielectric spacer, and an upper surface of the first phase change material.

2. The method of claim 1, wherein the first phase change material has a lower crystallization temperature or a shorter crystallization time than the second phase change material.

3. The method of claim 1, wherein the first phase change material comprises a substantially undoped material comprising GeSbTe, GeSb, SbTe, GeTe, AgInSbTe, or a combination thereof, and the second phase change material comprises a doped material comprising GeSbTe, GeSb, SbTe, GeTe, AgInSbTe, or a combination thereof, wherein a dopant is present in the second phase change material from greater than about 1 wt % to about 10 wt %, the dopant comprising oxygen, nitrogen, silicon oxide, silicon, carbon, silicon carbide, silicon nitride dopant or a combination thereof.

4. The method of claim 1, further comprising forming a second electrically conductive material on the planar upper surface, wherein the second electrically conductive material is in electrical communication with the upper surface of the first phase change material and the upper surface of the second phase change material.

5. The method of claim 1, wherein the forming of the pillar of the first phase change material comprises:
   depositing a layer of first phase change material on the substrate including the first electrically conductive material;
   depositing a first dielectric layer on the layer of the first phase change material;
   forming a photoresist mask to protect a first portion of the first dielectric layer, wherein a remaining portion of the first dielectric layer is exposed;
   etching the remaining portion of the first dielectric layer;
   removing the photoresist mask; and
   etching the layer of the first phase change material using the first portion of the first dielectric layer as an etch mask.

6. The method of claim 1, wherein following the forming of the layer of the second phase change material and before planarizing to provide the planar upper surface the method further comprises depositing a third dielectric layer.

7. The method of claim 1, wherein said first phase change material has a bottommost surface that is in direct physical contact with a top surface of said first electrically conductive material.

8. The method of claim 1, wherein said dielectric spacer is in direct physical contact with an entire outermost sidewall surface of said first phase change material, and a vertical sidewall surface of said second phase change material.

9. The method of claim 4, wherein said second electrically conductive material is in direct physical contact with an entire planar upper surface of said first phase change material, said dielectric spacer, and said second phase change material.

* * * * *